United States Patent
Vinayak et al.

(10) Patent No.: US 8,014,735 B2
(45) Date of Patent: Sep. 6, 2011

(54) RF POWER AMPLIFIER CONTROLLED BY ESTIMATED DISTORTION LEVEL OF OUTPUT SIGNAL OF POWER AMPLIFIER

(75) Inventors: Vikas Vinayak, Menlo Park, CA (US); Serge Francois Drogi, Flagstaff, AZ (US); Martin Tomasz, San Francisco, CA (US)

(73) Assignee: Quantance, Inc., San Mateo, CA (US)

( * ) Notice: Subject to any disclaimer, the term of this patent is extended or adjusted under 35 U.S.C. 154(b) by 947 days.

(21) Appl. No.: 11/935,614

(22) Filed: Nov. 6, 2007

(65) Prior Publication Data
US 2009/0117865 A1    May 7, 2009

(51) Int. Cl.
*H04B 1/04* (2006.01)
*H04B 17/00* (2006.01)
(52) U.S. Cl. ............... 455/114.3; 455/127.1; 455/115.1
(58) Field of Classification Search ............... 455/127.1, 455/127.2, 127.3, 194.2, 114.3, 115.1; 375/296, 375/297; 330/268, 274, 285, 296
See application file for complete search history.

(56) References Cited

U.S. PATENT DOCUMENTS

| | | | |
|---|---|---|---|
| 3,900,823 A | 8/1975 | Sokal et al. | |
| 4,420,723 A | 12/1983 | de Jager | |
| 5,128,629 A | 7/1992 | Trinh | |
| 5,142,240 A | 8/1992 | Isota et al. | |
| 5,675,288 A | 10/1997 | Peyrotte et al. | |
| 5,822,442 A | 10/1998 | Agnew et al. | |
| 5,880,633 A | 3/1999 | Leizerovich et al. | |
| 6,025,754 A * | 2/2000 | Czora | 330/296 |
| 6,043,707 A | 3/2000 | Budnik | |
| 6,133,792 A | 10/2000 | Hansson | |
| 6,141,541 A | 10/2000 | Midya et al. | |
| 6,166,596 A | 12/2000 | Higashiyama et al. | |
| 6,175,273 B1 | 1/2001 | Sigmon et al. | |
| 6,300,826 B1 | 10/2001 | Mathe et al. | |
| 6,353,359 B1 | 3/2002 | Leizerovich | |
| 6,377,784 B2 | 4/2002 | McCune | |
| 6,404,823 B1 | 6/2002 | Grange et al. | |
| 6,437,641 B1 | 8/2002 | Bar-David | |
| 6,445,249 B1 | 9/2002 | Khan et al. | |
| 6,472,934 B1 | 10/2002 | Pehlke | |
| 6,528,975 B2 | 3/2003 | Sander | |
| 6,583,664 B2 | 6/2003 | Mathe et al. | |

(Continued)

FOREIGN PATENT DOCUMENTS
EP    0812064 B1    12/1997
(Continued)

OTHER PUBLICATIONS
PCT International Search Report and Written Opinion, PCT/US2008/079622, Dec. 12, 2008, 10 pages.
(Continued)

*Primary Examiner* — Sonny Trinh
(74) *Attorney, Agent, or Firm* — Fenwick & West LLP (57) ABSTRACT

A radio frequency (RF) power amplifier system is provided, in which a distortion of the RF output signal from the power amplifier is estimated by comparing the RF output signal with reference modulation information. The supply voltage to the power amplifier is adjusted so that the estimated distortion of the RF output signal corresponds to a predetermined distortion level. The predetermined distortion level is set to represent an acceptable distortion level at the RF output signal.

25 Claims, 9 Drawing Sheets

U.S. PATENT DOCUMENTS

| | | | |
|---|---|---|---|
| 6,646,501 B1 | 11/2003 | Wessel | |
| 6,661,210 B2 | 12/2003 | Kimball et al. | |
| 6,781,452 B2 | 8/2004 | Cioffi et al. | |
| 6,803,822 B2 * | 10/2004 | Kim et al. | 330/296 |
| 6,831,517 B1 * | 12/2004 | Hedberg et al. | 330/285 |
| 6,859,102 B2 * | 2/2005 | Tichauer | 330/285 |
| 6,917,244 B2 | 7/2005 | Rosnell et al. | |
| 6,924,695 B2 | 8/2005 | Cioffi et al. | |
| 6,924,700 B2 | 8/2005 | Taura et al. | |
| 6,924,711 B2 | 8/2005 | Liu | |
| 6,928,272 B2 | 8/2005 | Doi | |
| 7,058,373 B2 | 6/2006 | Grigore | |
| 7,109,897 B1 | 9/2006 | Levesque | |
| 7,197,286 B2 | 3/2007 | Ode et al. | |
| 7,492,223 B2 * | 2/2009 | Behzad et al. | 330/136 |
| 7,679,449 B2 * | 3/2010 | Behzad et al. | 330/285 |
| 7,750,733 B2 * | 7/2010 | Sorrells et al. | 330/124 R |
| 2002/0053897 A1 | 5/2002 | Kajiwara et al. | |
| 2002/0168949 A1 | 11/2002 | Johannisson et al. | |
| 2003/0017840 A1 | 1/2003 | Katagishi et al. | |
| 2003/0155978 A1 | 8/2003 | Pehlke | |
| 2004/0071225 A1 | 4/2004 | Suzuki et al. | |
| 2004/0162039 A1 | 8/2004 | Marque-Pucheu | |
| 2004/0189378 A1 | 9/2004 | Suzuki et al. | |
| 2004/0263254 A1 | 12/2004 | Tahara et al. | |
| 2005/0064830 A1 | 3/2005 | Grigore | |
| 2005/0122163 A1 | 6/2005 | Chu | |
| 2005/0156662 A1 | 7/2005 | Raghupathy et al. | |
| 2005/0242880 A1 | 11/2005 | Domokos et al. | |
| 2006/0001483 A1 | 1/2006 | Cioffi et al. | |
| 2007/0096806 A1 | 5/2007 | Sorrells et al. | |
| 2007/0184796 A1 | 8/2007 | Drogi et al. | |

FOREIGN PATENT DOCUMENTS

| | | |
|---|---|---|
| WO | WO 9534128 A1 | 12/1995 |

OTHER PUBLICATIONS

"The Changing Face of Amplifier Design," Nujira, [online] [Retrieved on Apr. 5, 2006] Retrieved from the Internet<URL:http://www.nujira.com/technology/>.

Fergus, T.J., "Edge Modulation—How Linearization Improves Amplifier Performance," RFDesign, Oct. 2002, 7 pages.

"LF-2.7 GHz RF/IF Gain and Phase Detector, AD8302," Analog Devices, Inc., 2002, [online] [Retrieved on Apr. 5, 2006] Retrieved from the Internet<URL:http://www.analog.com/UploadedFiles/Data_Sheets/797075782AD8302_a.pdf#search='AD83 02'>.

McCune, Jr., E.W., "Direct Polar Modulation has the Right Stuff," CommsDesign, Nov. 7, 2005, [online] [Retrieved on Apr. 5, 2006] Retrieved from the Internet<URL:http://www.commsdesign.com/showArticle.jhtm?articleID=173500205>.

Silicon Laboratories, Inc., 2005, 6 pages, [online] [Retrieved on Apr. 5, 2006] Retrieved from the Internet<URL:http://www.silabs.com/public/documents/marcom_doc/mcoll/Wireless/Aero_RF_Transceivers/en/Aerolle_Overview.pdf>.

Raab, F. et al., "RF and Microwave Power Amplifier and Transmitter Technologies—Part 3," High Frequency Electronics, Sep. 2003, pp. 34-48.

Raab, F. et al., "RF and Microware Power Amplifier and Transmitter Technologies—Part 4," High Frequency Electronics, Nov. 2003, pp. 38-49.

"SEQ5400—The World's First Single-Chip WEDGE Transceiver," Sequoia Communications, [online] [Retrieved on Apr. 5, 2006] Retrieved from the Internet<URL:http:www.sequoia-communications.com/SEQ5400Data_Sheet.pdf>.

Sowlati, T. et al., "Polar Loop Transmitter," Skyworks™, [online] [Retrieved on Apr. 5, 2006] Retrieved from the Internet<URL:http://paworkshop.ucsd.edu/papers2004/S1_2Polar%20Loop%/20Transmitter.ppt>.

Wilkins, B. et al., "Large Signal Polar Modulation Reduces Heat Dissipation and Increases Battery Life in EDGE Handsets" Feb. 2005, Microwave Product Digest, [online] [Retrieved on Apr. 5, 2006] Retrieved from the Internet<URL:http:www.mpdigest.com/Articles/2005/feb2005/rfmd/Default.htm>.

* cited by examiner

FIG. 1

(PRIOR ART)

RF POWER AMPLIFIER CONTROLLED BY ESTIMATED DISTORTION LEVEL OF OUTPUT SIGNAL OF POWER AMPLIFIER

BACKGROUND OF THE INVENTION

1. Field of the Invention

The present invention relates to a circuit for controlling RF PAs (Radio Frequency Power Amplifiers), and more specifically, to an RF PA controller circuit that adjusts the supply voltage of RF PAs.

2. Description of the Related Art

RF (Radio Frequency) transmitters and RF power amplifiers are widely used in portable electronic devices such as cellular phones, laptop computers, and other electronic devices. RF transmitters and RF power amplifiers are used in these devices to amplify and transmit the RF signals remotely. RF PAs are one of the most significant sources of power consumption in these electronic devices, and their efficiency has a significant impact on the battery life of these portable electronic devices. For example, cellular telephone makers make great efforts to increase the efficiency of the RF PA systems, because the efficiency of the RF PAs is one of the most critical factors determining the battery life of the cellular telephone and its talk time.

Figure 1:
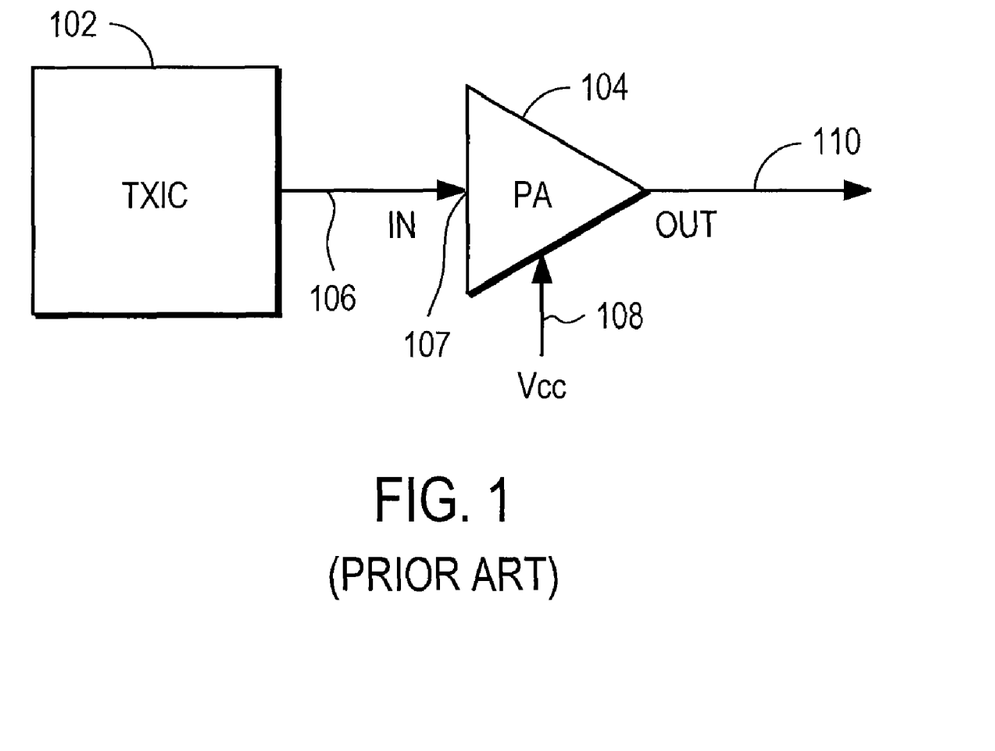

Figure (FIG.) 1 illustrates a conventional RF PA system. The conventional RF PA system includes a transmitter integrated circuit (TXIC) 102 and an external power amplifier (PA) 104. In some cases, there may be a filter between the TXIC 102 and the PA 104. For example, the RF transmitter circuit may be included in a cellular telephone device using one or more cellular telephone standards (modulation techniques) such as UMTS (Universal Mobile Telephony System) or CDMA (Code Division Multiple Access), although the RF transmitter circuit may be included in any other type of RF electronic devices. For purposes of illustration only, the RF transmitter circuit will be described herein as a part of a cellular telephone device. The TXIC 102 generates the RF signal 106 to be amplified by the PA 104 and transmitted 110 remotely by an antenna (not shown). For example, the RF signal 106 may be an RF signal modulated by the TXIC 102 according to the UMTS or CDMA standard.

The RF power amplifier 104 in general includes an output transistor (not shown) as its last amplification stage. When an RF modulated signal 106 is amplified by the PA 104, the output transistor tends to distort the RF modulated signal 106, resulting in a wider spectral occupancy at the output signal 110 than at the input signal 106. Since the RF spectrum is shared amongst users of the cellular telephone, a wide spectral occupancy is undesirable. Therefore, cellular telephone standards typically regulate the amount of acceptable distortion, thereby requiring that the output transistor fulfill high linearity requirements. In this regard, when the RF input signal 106 is amplitude-modulated, the output transistor of the PA 104 needs to be biased in such a way that it remains linear at the peak power transmitted. This typically results in power being wasted during the off-peak of the amplitude of the RF input signal 106, as the biasing remains fixed for the acceptable distortion at the peak power level.

Certain RF modulation techniques have evolved to require even more spectral efficiency, and thereby forcing the PA 104 to sacrifice more efficiency. For instance, while the efficiency at peak power of an output transistor of the PA 104 can be above 60%, when a modulation format such as WCDMA is used, with certain types of coding, the efficiency of the PA 104 falls to below 30%. This change in performance is due to the fact that the RF transistor(s) in the PA 104 is maintained at an almost fixed bias during the off-peak of the amplitude of the RF input signal 106.

Certain conventional techniques exist to provide efficiency gains in the PA 104. One conventional technique is EER (Envelope Elimination and Restoration). The EER technique applies the amplitude signal (not shown in FIG. 1) and the phase signal (not shown in FIG. 1) of the RF input signal 106 separately to 2 ports of the power amplifier 104, i.e., its supply voltage port (Vcc) 108 and its RF input port 107, respectively. However, the EER technique often fails to provide significant efficiency gains, because the supply voltage 108 cannot be varied in an energy-efficient way to accommodate the large variations in the amplitude signal of the RF input signal 106; and thus, it fails to provide a substantial energy efficiency gain while maintaining the required linear amplification of the RF signal in the PA 104. This is mainly due to the difficulty in realizing a fast, accurate, wide range, and energy efficient voltage converter to drive the supply voltage of the PA 104.

The conventional EER technique can function better only if a variable power supply with a very large variation range is used to adjust the supply voltage based on the amplitude signal of the RF input signal 106, while not reducing the efficiency of the RF transmitter by the power consumed by the power supply itself. However, the variable power supply, which is typically comprised of a linear regulator (not shown in FIG. 1) that varies its output voltage on a fixed current load such as the PA 104 in linear mode, by principle reduces the supply voltage at constant current and by itself consumes the power resulting from its current multiplied by the voltage drop across the linear regulator when there is a large drop in the amplitude signal of the RF input signal 106. This results in no change in the overall battery power being consumed by the RF transmitter because any efficiency gained in the PA 104 is mostly lost in the linear regulator itself.

Variations of the EER technique, such as Envelope Following and other various types of polar modulation methods, likewise fails to result in any significant gain in efficiency in the RF transmitter, because the supply voltage is likewise adjusted based on the amplitude signal of the RF input signal 106 which inherently has large variations; and thus, has the same deficiencies as described above with respect to conventional EER techniques.

Some other conventional techniques improve the efficiency in the PA 104 by lowering the supply voltage 108 to the PA 104. In many of these techniques, both amplitude and phase components of the RF input signal 106 are fed to the PA 104 in a conventional manner. By using a lower supply voltage 108, the PA 104 operates with increased power efficiency because it operates closer to the saturation point. However, the supply voltage 108 cannot be reduced too low, because this would cause the PA 104 to operate with insufficient voltage headroom, resulting in unacceptable distortion. As described previously, the distortion may cause energy from the transmitted signal to spill over to adjacent channels, increasing spectral occupancy and causing interference to radios operating in those neighboring channels. Thus, an optimal supply voltage can be chosen for the PA which balances acceptable distortion with good efficiency.

One conventional method uses a step-down switched mode power supply (SMPS) (i.e., buck regulator) to lower the supply voltage 108 to the PA 104. However, choosing a fixed power supply voltage is not sufficient in many applications. For example, in most cellular systems, the PA output power changes frequently because the basestation commands the cellular handset to adjust its transmitted power to improve network performance, or because the handset changes its transmitted information rate. When the PA output power changes, the optimum supply voltage for the PA (as described above) changes.

Therefore, in some systems, the expected power of the RF output signal 110 is first determined, and then the power supply voltage 108 is adjusted in accordance with the expected power. By adaptively adjusting the supply voltage 108, the efficiency of the PA 104 is increased across various PA output power levels. Conventional methods estimate the expected power of the RF output signal 110 in an "open loop" manner, in which the power of the RF output signal 110 is estimated from the power of the delivered RF input signal 106. This method does not yield an accurate estimate of the power of the RF output signal 110 because the estimated power may vary according to various operating conditions, such as temperature, frequency, and mismatch. Therefore, even if the estimated power at some point approximates the actual power, changes in operating conditions result in deviation of the estimated power from the actual power.

Moreover, an estimate of the power of the RF output signal 110 may not be sufficient for properly adjusting the supply voltage 108. For example, the peak-to-average ratio (PAR) needs to be known in order to estimate the optimum supply voltage for the PA. The PAR refers to the difference of the mean amplitude and the peak amplitude in the modulated RF output signal 110. With a higher PAR, a higher supply voltage is needed to accommodate the peak voltage swings of the RF output signal 110. Many modern cellular systems change the PAR of the modulation in real time, requiring the supply voltage to be adjusted accordingly. Therefore, the conventional method of adjusting the supply voltage 108 of PA 104 based on an estimate of the PA output power is unsuitable in these cellular systems.

Further, the load presented to the PA 104 poses another problem. The PA 104 normally drives circuitry usually consisting of a filter and an antenna. Such circuitry often has an impedance around the range of 50 ohms. The impedance of the circuitry can sometimes change radically. For example, if the antenna is touched or the cellular device is laid down on a metal surface, the impedance of the circuitry changes. The changes in the impedance of the circuitry coupled to the PA 104 may require changes in the supply voltage to the PA 104 to prevent distortion of the RF output signal 110 fed to this circuitry. The conventional methods described above, however, do not adjust the supply voltage in response to changes in the impedance of the circuitry.

Although the problems of inaccurate estimation of power at the RF output signal 110, changing PAR, and impedance changes at the output of PA 104 can be avoided by constantly providing a higher than optimum supply voltage to the PA 104, the higher supply voltage leads to a less efficient PA 104.

Thus, there is a need for a PA system that is efficient over a wide variety of modulation techniques and results in a significant net increase in power efficiency of the PA system. Additionally, there is a need for a PA controller that can adjust the power supply to the PA under conditions of varying temperature, frequency, output power, PAR, and impedance to maximize the PA efficiency while keeping distortion to an acceptable level.

SUMMARY OF THE INVENTION

Embodiments of the present invention include a RF power amplifier system in which a distortion of the RF output signal from the power amplifier is estimated by comparing the RF output signal with reference modulation information and the supply voltage to the power amplifier is adjusted so that the estimated distortion of the RF output signal corresponds to a predetermined distortion level. The predetermined distortion level is set to represent an acceptable distortion level at the RF output signal.

In a first embodiment of the present invention, the RF output signal from the PA is downconverted in frequency, and compared in time-domain against the reference baseband modulation information from the transmitter. The result of the comparison provides the estimated distortion level, which is then compared with a predetermined distortion level, to generate a supply voltage control signal. The supply voltage control signal in turn adjusts the supply voltage to the power amplifier. The supply voltage to the power amplifier is increased if the estimated distortion level is greater than the predetermined distortion level and decreased if the estimated distortion level is smaller than the predetermined distortion level. Thus, a control loop is created to servo the supply voltage to the power amplifier in a manner which targets an acceptable distortion level in the RF output signal. In addition to setting the supply voltage to the PA, the result of the comparison simultaneously offers a rapid measure of the power of the RF output signal of the PA with respect to a reference level from the transmitter, thus providing additional control means to adjust the power of the RF input signal to the PA to compensate for unwanted changes in the PA output power due to a change in the PA supply voltage.

In a second embodiment of the present invention, a power amplifier controller adjusts the supply voltage to the power amplifier in a similar fashion to the first embodiment. However, in the second embodiment, only the amplitude of the RF output signal of the PA is compared in time-domain with the amplitude of the reference modulation from the transmitter to determine the estimated distortion level. The advantage of the second embodiment includes reduction in circuit complexity. Since a downconversion of the RF output signal of the PA is not required, a local oscillator and downconverting mixer circuitry are not required.

In a third embodiment of the present invention, the RF PA system of the second embodiment is used, but the third embodiment additionally includes a phase correction loop. The phase correction loop compares the phase of the RF input signal to the phase of the RF output signal, and adjusts the phase shift between the RF input signal and the RF output signal of the PA to compensate for phase shifts caused by the PA while it passes the RF signal modulation, which is commonly referred to as AM-PM remodulation.

The RF PA systems according to embodiments of the present invention are capable of measuring the distortion in the RF output signal and the output power level of the RF output signal accurately and very fast, because fundamentally they compare input and output samples, aligned in time, on a sample by sample basis, rather than averaging the waveforms over a long period. Therefore, according to the present invention, a RF PA system can be implemented with a very fast response time, suitable for use in cellular communication systems.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments of the present invention can be readily understood by considering the following detailed description in conjunction with the accompanying drawings.

Figure (FIG.) 1 illustrates a conventional RF PA system.

DETAILED DESCRIPTION OF EMBODIMENTS

The Figures (FIG.) and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

Figure 2A:
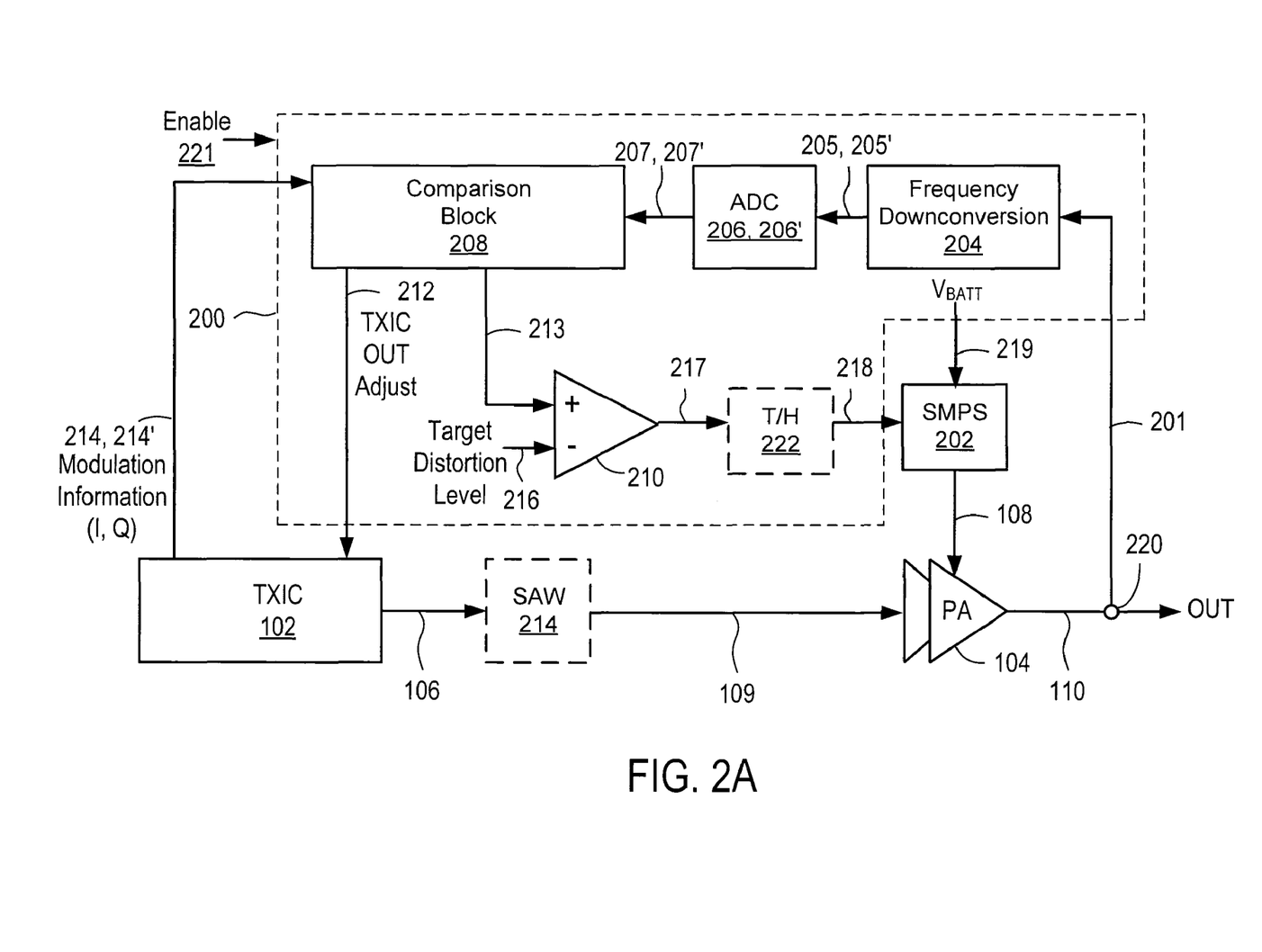
FIG. 2A illustrates an RF PA system that includes a PA controller for adjusting the supply voltage to the power amplifier based upon an estimated distortion level of the output of the PA compared to a target distortion level, according to a first embodiment of the present invention.

FIG. 2A illustrates an RF PA system that includes a PA controller for adjusting the supply voltage to the power amplifier based upon an estimated distortion level of the output of the PA compared to a target distortion level, according to a first embodiment of the present invention. The RF PA system of FIG. 2A comprises, among other components, a power amplifier (PA) 104, a power supply (e.g., switched mode power supply (SMPS)) 202, and a PA controller 200. The PA 104 receives the RF input signal 106 from the TXIC 102 through a SAW filter 214, amplifies it, and outputs the RF output signal 110. The RF input signal 106 is a modulated RF signal that is modulated by the baseband TXIC 102 according to a wireless communication standard, such as 3GPP. The SAW filter 214 is optional and is needed if the TXIC output signal 106 needs to be filtered to suppress unwanted noise outside the desired band. The power supply 202 is coupled to a voltage $V_{BATT}$ 219 to provide the supply voltage 108 to the PA 104. The overall function of the PA controller 200 is to adjust the supply voltage 108 to the PA 104 to a level as low as possible while maintaining the distortion of the RF output signal 110 near an acceptable limit (e.g., a limit defined by standards covering the RF mobile device, such as 3GPP specifications). By keeping the supply voltage 108 of the PA 104 as low as possible, the efficiency of the PA 104 is increased significantly.

Figure 2B:
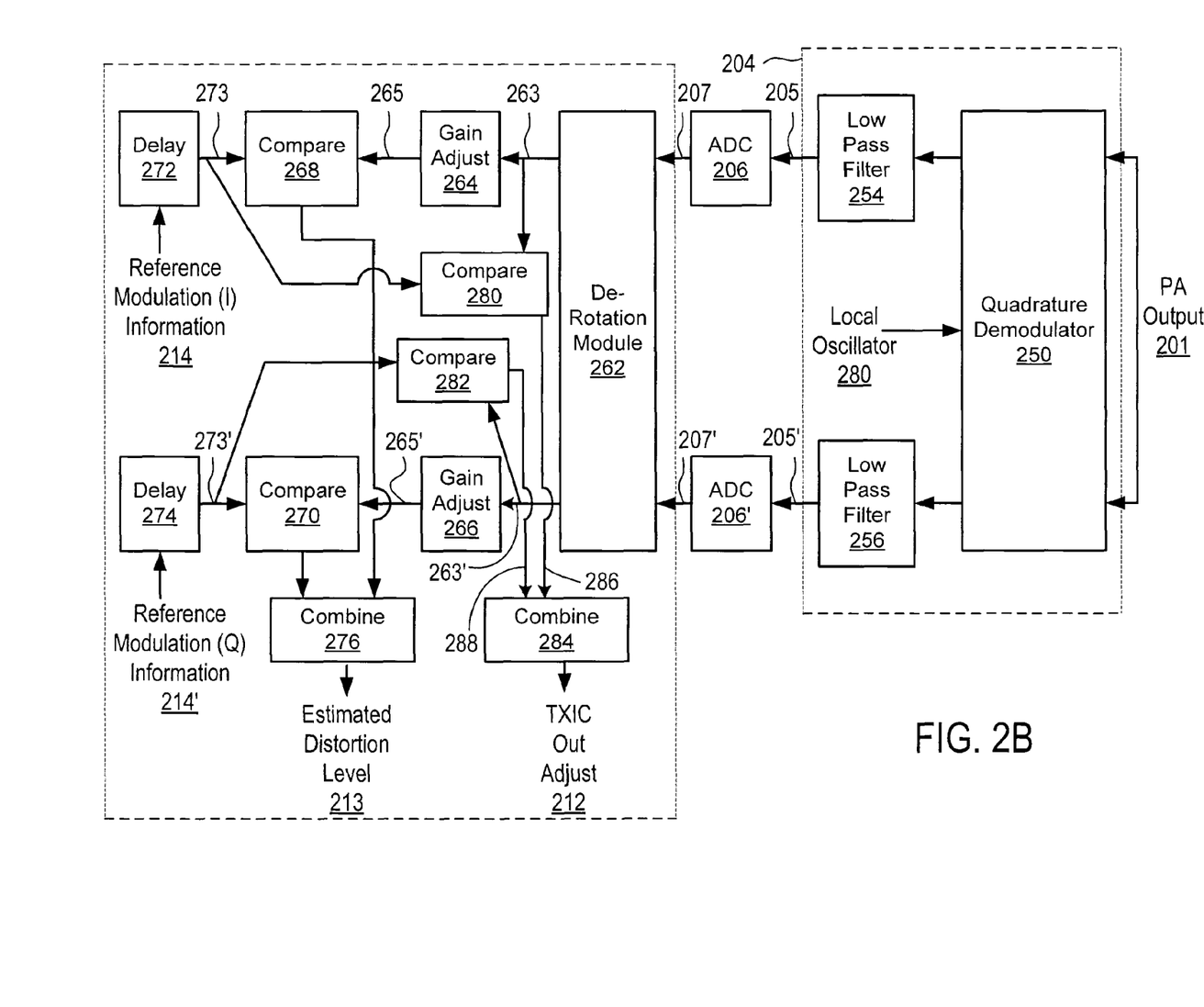
FIG. 2B illustrates the frequency downconversion block and the comparison block of FIG. 2A in more detail, according to the first embodiment of the present invention.

The PA controller 200 includes, among other components, a frequency downconversion module 204, analog-to-digital converters (ADCs) 206, 206', a comparison block 208, an error amplifier 210, and an optional track and hold (T/H) block 222. The frequency downconversion module 204 receives the RF output signal 110 through a coupler or capacitive tap 220. Thus, the detected RF output signal 201 could be attenuated from the RF output signal 110. The detected RF output signal 201 includes both amplitude and phase, and as will be explained in more detail with reference to FIG. 2B, is downconverted by the frequency downconversion module 204. The downconverted RF output signals 205, 205' are converted to digital signals 207, 207' by the ADCs 206, 206', respectively, and compared in time-domain (waveform to waveform) to the reference baseband modulation information 214, 214' (I, Q modulation information) from the TXIC 102 to generate an estimated distortion level signal 213 indicating the actual level of distortion in the RF output signal 110. A time-domain comparison means that signal points of the waveforms for the digital signals 207, 207' and the reference baseband modulation information signals 214, 214' are aligned in time with each other and compared, point-to-point. The comparison algorithm may include some additional processing, as will be described later.

Since a delay exists in the transmission path of the RF PA system, primarily dominated by the SAW filter 214 (but also contributed to by the PA 104, the PA's interstage and output matching networks (not shown herein), and the latency of the feedback path, including ADCs 206, 206'), a delay (e.g., 1 microsecond) is added to the reference modulation signal 214, 214' for proper alignment before comparison with the PA output modulation 207, 207'. The delay to add can be determined empirically. Aligning the waveforms for the digital signals 207, 207' and the reference baseband modulation information signals 214, 214' in time domain may be achieved using, for example, a cross-correlation function. Note that since the time skew between the waveforms of the digital signals 207, 207' and the reference baseband modulation information signals 214, 214' usually does not change rapidly, the alignment process may occur only periodically with respect to the comparison of input and output signals, and thus does not substantially affect the response time of the system.

In order to generate the estimated distortion level signal 213, the voltage differences between the aligned waveforms for the digital signals 207, 207' and the reference baseband modulation information signals 214, 214', respectively, are measured. The estimated distortion level signal 213 is compared to a predetermined target distortion level signal 216 in the error amplifier 210 to generate a supply voltage control signal 217. The target distortion level signal 216 is set to represent an acceptable distortion level at the RF output signal 110. For example, the target distortion level 216 can be set to a constant level corresponding to an EVM (error vector magnitude) level of 3% at output 110 of the PA 104. Thus, a control loop is created to servo the supply voltage 108 to the PA 104 in a manner which targets the acceptable distortion level in the RF output signal 110. Note that, while an error amplifier 210 is shown here, the error amplifier 210 may be replaced by any element which causes an increase or decrease in the supply voltage 108 based on a difference between the estimated distortion level signal 213 and the target distortion level 216.

During the operation of the RF PA system, the PA controller 200 finds the optimum level of supply voltage 108 by adjusting the supply voltage 108. If the supply voltage 108 to the PA 104 is initially higher than the optimum level, the supply voltage 108 to the PA 104 is decreased by operation of the PA controller 200. As the supply voltage 108 is decreased, the operating point of the PA 104 approaches closer to a saturation point where there is less voltage headroom for the PA 104 to operate. This results in increased distortion in the RF output signal 110 which is shown as an increase in the estimated distortion level 213, as compared to the reference modulation information 214, 214'. When the distortion of the RF output signal 110 as indicated by the estimated distortion level signal 213 increases beyond the allowable level as defined by the target distortion level 216, the supply voltage control signal 217 from the error amplifier 210 is increased, causing the power supply 202 to provide a higher supply voltage 108 to the PA 104. When the supply voltage 108 is increased, the operating point of the PA 104 shifts away from the saturation point to an operating point where the PA 104 has more voltage headroom, resulting in a decrease of distortion in the RF output signal 110. This in turn leads to decrease in the estimated distortion level 213. On the other hand, if the estimated distortion level signal 213 falls below the target distortion level 216, the supply voltage control signal 217 is now decreased, causing the power supply 202 to provide a lower supply voltage 108 to the PA 104. Thus, the operating point of the PA 104 again shifts away from the saturation point to an operating point where the PA 104 has more voltage headroom, resulting in a decrease of distortion in the RF output signal 213. In essence, by increasing or decreasing the supply voltage 108 based on a comparison between the estimated distortion level 213 and the target distortion level 216, the supply voltage 108 is adjusted to an optimum voltage level where the distortion in the RF output signal 110 corresponds to a predetermined allowable level set by the target distortion level signal 216. The supply voltage 108 in essence operates as a bias control signal that controls the operating point of the PA 104.

The supply voltage 108 is adjusted optimally even when changes occur in the impedance of the circuitry (not shown) receiving the RF output signal 110. The PA 104 may normally drive circuitry usually comprised of a filter (not shown) and an antenna (not shown), with a typical impedance of 50 Ohms. However, if the antenna is touched or the cellular device including the RF PA system is laid down on a metal surface, the load presented by the circuitry receiving the RF output signal 110 is changed, which in turn changes the operating point of the PA 104. The optimum voltage level of the supply voltage 108 thus changes. The PA controller 200 then increases or decreases the supply voltage 108 to match the target distortion level 216, to a new optimum voltage level as described above. Therefore, the PA system can maintain high efficiency while maintaining the level of distortion in the RF output signal 110 even when the load presented to the PA 104 changes.

Both the output power as well as the PAR (Peak to Average Ratio) of the RF output signal 110 may change frequently in modern cellular systems. For example, UMTS mobiles may change transmit power levels at least once per 667 microseconds in a closed loop power control scheme controlled by the basestation, and additionally may handle transmit power bursts due to special control signaling at other times. UMTS mobiles also must accommodate transmit modulation PAR changes when the modulation scheme is changed to accommodate higher data rates. An increase in either the output power or PAR of the RF output signal 110 may cause the operating point of the PA 104 to move closer towards compression, resulting in a higher level of distortion. The PA controller 200 responds by increasing the supply voltage 108 until the distortion matches the target distortion level 216, resulting in a new optimum voltage level as described above. A decrease in either the output power or PAR of the RF output signal similarly causes the PA controller 200 to respond by decreasing the supply voltage 108. Thus, the PA controller 200 can maintain a high efficiency while maintaining the level of distortion in the RF output signal 110 even when the RF output power or PAR of the RF output signal 110 changes dynamically.

The components of the PA controller 200 may be enabled in intervals and disabled between the intervals to decrease the power consumption of the PA controller 200. That is, once the PA controller 200 has set the supply voltage 108, some of the components of the PA controller 200 may be disabled by use of an enable signal 221 during periods when the operating conditions (e.g. output power, frequency, PAR, impedance mismatch) of the PA 104 remain approximately static. Disabling the PA controller 200 would hold constant the supply voltage 108, thus decreasing the overall power consumption of the PA controller 200.

Further, the power consumption of the power supply 202 may be reduced during the periods when the PA controller 200 is disabled. Since the PA supply voltage 108 is held constant during this period, the PA power supply 202 may reduce its operating supply current and thus operate in a more efficient, reduced-bandwidth "slow" mode. During the intervals when the PA controller 200 is enabled, the power supply 202 may revert to operation in a "fast" mode in which it is capable of rapidly changing its output voltage 108 in response to the PA controller 202. In the fast mode, the power supply 299 may operate with higher supply current because it must support higher bandwidth required to rapidly slew the output voltage 108.

In this regard, the optional track and hold (T/H) block 222 may be provided to track the rapidly changing supply voltage control signal 217 during "fast mode" while holding constant the supply voltage control signal during "slow mode." The track/hold block 222 receives the supply voltage control signal 217 from the error amplifier 210 and outputs the supply voltage control signal 218 to the power supply 202. If the track/hold module 222 is in "track" or "fast" mode, the output 218 of the track/hold module 222 follows the output signal 217 of the error amplifier 210. If the track/hold module 222 is in "hold" or "slow" mode, the track/hold module 222 continues to output the supply voltage control signal 218 determined at the time the "hold" mode was entered.

Adjusting the supply voltage 108 may cause some change in the gain of the PA 104. If the PA gain change causes an unwanted error in the power level at the RF output signal 110, the RF input signal 106 may be adjusted in amplitude to compensate for the unwanted error, thus ensuring that the RF output signal 110 maintains an accurate power level. For example, the TXIC 102 may adjust the amplitude of its RF signal 106 based on a measurement of the power at the RF output signal 110. In this regard, in addition to setting the supply voltage 108 to the PA 104, the TXIC OUT adjust signal 212 is generated by the comparison block 208 to additionally provide a rapid measure of the power of the RF output signal 110 of the PA 104 with respect to a reference level 214, 214' from the transmitter 102. The TXIC OUT adjust signal 212 may be generated by calculating the difference in the amplitude levels of the reference baseband signals 214, 214' and the amplitude of the digital signals 207, 207' as will be described in more detail below. If the TXIC adjust signal 212 indicates that the RF output signal 110 is too high, the TXIC 102 responds by lowering the RF input signal 106. If the TXIC adjust signal 212 indicates that the RF output signal 110 is too low, the TXIC 102 responds by increasing the RF input signal 106. Thus, a control means is additionally provided to adjust the input power to the PA 104 from the TXIC 102 to compensate for the unwanted changes in the PA output power caused by the change in the PA supply voltage. The same control means can also compensate for changes in the PA output power caused by a change in the load presented by the circuitry receiving the RF output signal 110.

FIG. 2B illustrates examples of the frequency downconversion block and the comparison block of FIG. 2A in more detail, according to the first embodiment of the present invention. The frequency downconversion block 204 includes a quadrature demodulator 250, a local oscillator 280, and low pass filters 254, 256. The comparison block 208 includes a de-rotation module 262, gain adjust modules 264, 266, compare modules 268, 270, 280, 282, delay modules 272, 274, and combine module 276, 284.

The I and Q components of the detected PA output signal 201 are downconverted in quadrature by the quadrature demodulator 250. The local oscillator 280 for the quadrature demodulator 250 is preferably the same one (not shown) as what is used in the TXIC 102, so no frequency error is generated. The low pass filters 254, 256 filter unwanted frequencies of the downconverted I and Q components of the PA output signal 201, such as local oscillator leakage. The filtered I and Q components 205, 205' are converted to digital signals by the ADCs 206, 206', and forwarded to the de-rotation module 262 of the comparison block 208. The ADCs 206, 206' have, for example 10 bits resolution, for sufficient resolution such that the ADCs 206, 206' themselves do not contribute significantly to the distortion.

The de-rotation module 262 adjusts the reference phasing of the I and Q coordinates 207, 207' to compensate for the phase difference between the PA output signal 201 and the local oscillator 280 and to match the phasing of the reference modulation I, Q signals 214, 214'. The de-rotation module 262 may consist of a pair of complex multipliers (not shown) which multiply the signals 207, 207' by the required phase offset. The required phase offset may be calculated as the phase offset which minimizes the estimated distortion level signal 213 (described later). As mentioned earlier, the phase offset may not change rapidly, and thus may need to be updated by the de-rotation module 262 only periodically. The phase-adjusted digital I and Q signals 263, 263' are input to the gain adjust modules 264, 266, respectively, that adjust the amplitudes of the phase-adjusted digital I and Q signals 263, 263' to be consistent with the amplitude level of the I and Q reference modulation information 214, 214'. Although in the embodiment of FIG. 2B the gain adjust modules 264 and 266 and the de-rotation module 262 are present on the PA output signal 201 side to adjust its amplitude and phasing, respectively, note that there could be gain adjust modules and the de-rotation module on the reference module information side in addition to, or in place of, the gain adjust modules 264 and 266 and the de-rotation module 262 on the PA output signal 201 side, so that the comparison is made with signals having comparable amplitude and phasing offset levels. Alternatively, or additionally, the sensed PA output signal 201 may be attenuated or adjusted to achieve the gain adjustment function. In yet another example, the de-rotation module 262 may be replaced entirely by adjusting the phase of the local oscillator 280.

The I-reference modulation information 214 and the Q-reference modulation information 214' are input to delays 272, 274, respectively, that add a delay to these signals to align the waveforms of the I-reference modulation information 214 and the Q-reference modulation information 214' to the PA output signal 201 as explained above. The I-reference modulation information 214 and the Q-reference modulation information 214' provide reference information on the how the RF signal was modulated by the baseband TXIC 102 and thus provide a basis for determining whether the PA output signal 201 is distorted or not and the degree of its distortion.

The compare modules 268, 270 compare the amplitudes of the waveforms of the delayed I and Q reference modulation signals 273, 273' with the waveforms of the amplitudes of the gain adjusted, phase adjusted I and Q signals 265, 265', respectively. For example, the amplitude difference may be calculated directly from the compared waveforms by subtraction. Preferably, the logarithms of the waveforms may be subtracted, so as to yield a difference related to the ratio of the amplitudes of the waveforms. Alternatively, the compared waveforms may be subtracted, and this difference divided by the delayed I and Q reference modulation signals 273, 273'. Additional signal processing steps may further refine this process. For example, using signal processing to determine the modulation timing, only the samples corresponding to the modulation constellation points may be compared. Comparing the waveforms at these points is relevant because the signal is typically demodulated by a receiver using these timing instants only. In yet another refinement, a scaling may be applied when calculating the difference between waveforms, to emphasize the effect of differences at high amplitudes and de-emphasize differences at low amplitudes, thus more accurately estimating the power of the distortion.

The results of such amplitude comparison in the compare modules 268, 270 are combined in the combine module 276 to generate the estimated distortion level signal 213. The combine module 276 calculates the combined error corresponding to the respective errors in the amplitudes of I, Q, i.e., the error between the amplitudes of the delayed I and Q reference modulation signals 273, 273' and the amplitudes of the gain adjusted, phase adjusted I and Q signals 265, 265', respectively. For example, the estimated distortion level signal 213 could be the magnitude of $\sqrt{I_{err}^2 + Q_{err}^2}$, where $I_{err}$ is the amplitude difference between delayed I reference modulation signal 273 and the gain adjusted, phase adjusted I signal 265 and $Q_{err}$ is the amplitude difference between delayed Q reference modulation signal 273' and the gain adjusted, phase adjusted Q signal 265'.

The compare modules 280, 282 compare the amplitudes of the waveforms of the delayed I and Q reference modulation signals 273, 273', respectively, with the waveforms of the amplitudes of the phase-adjusted digital I and Q signals 263, 263', respectively. The results 286, 288 of such comparison are combined in the combine modules 286, 288, respectively, to generate the TXIC OUT adjust signal 212.

The RF PA controller of FIGS. 2A and 2B measures the distortion in the RF output signal in the form of the estimated distortion level signal 213 and servos the power supply powering the PA 104 to a desired distortion level. At the same time, the RF PA controller also provides the means to maintain an accurately controlled power level at the PA output with the use of the TXIC OUT Adjust signal 212, as a side benefit. The TXIC OUT Adjust signal 212 provides an estimate of the offset between the actual amplitude versus desired amplitude at the PA output 201 by comparing the averaged amplitude levels of the delayed I and Q reference modulation signals 273, 273' with the average amplitude levels of the phase-adjusted digital I and Q signals 263, 263', respectively. The sign and magnitude of the difference in such averaged amplitude levels is indicated at the TXIC OUT Adjust signal 212, which is passed to the TXIC 102 to correct the offset by raising or lowering its drive level to the PA 104. Thus, the TXIC OUT Adjust signal 212, together with the TXIC 102, form a servo loop which aims to control the output power of the PA 104. The power supply and gain adjustments are done simultaneously and very fast, because they compare waveforms, rather than averaging the waveforms over a long period. This is very beneficial in cellular radio systems. For instance, if the cellular basestation commands the mobile device to increase its power by, for example, 7 dB. The mobile device does so by increasing the RF power level input to the PA. However, in a conventional system where the power supply voltage is adjusted to maximize the PA efficiency, one must guess the supply voltage required to prevent distortion from the PA while still maintaining efficiency. Such power supply voltage in the conventional RF PA systems will be not be optimal, because the effects of temperature, frequency, output power, PAR and mismatch, which means distortion is guaranteed to be acceptable but efficiency will suffer. In contrast to conventional PA controllers, the PA controller of FIGS. 2A and 2B is very fast, and can quickly correct the power supply and lower it so that the PA can operate more efficiently. At the same time, it corrects the PA output power from changing while the power supply is being adjusted, by measuring the PA output power and adjusting the input power to the PA at the same time.

Figure 3A:
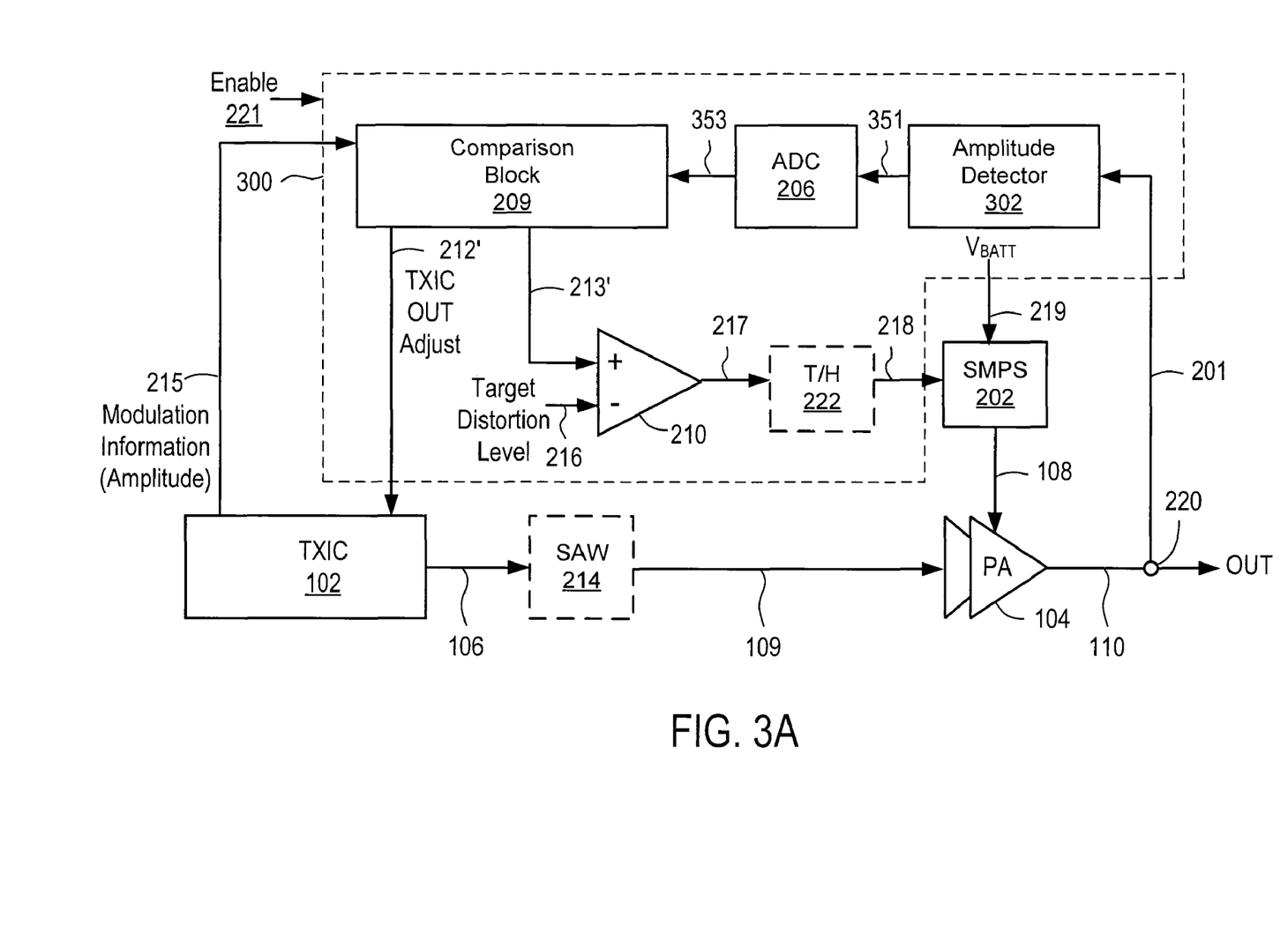
FIG. 3A illustrates an RF PA system that includes a PA controller for adjusting the supply voltage to the power amplifier based upon an estimated distortion level of the output of the PA compared to a target distortion level, according to a second embodiment of the present invention.

FIG. 3A illustrates an RF PA system that includes a PA controller for adjusting the supply voltage to the power amplifier based upon an estimated distortion level of the output of the PA compared to a target distortion level, according to a second embodiment of the present invention. The second embodiment of FIG. 3A is similar to the first embodiment of FIG. 2A, except that the measured distortion level signal 213' and the TXIC OUT adjust 212' are generated based upon the amplitude of the RF output signal 110 but not the phase of the RF output signal 110.

The RF PA system of FIG. 3A comprises, among other components, a power amplifier (PA) 104, a power supply (e.g., switched mode power supply (SMPS)) 202, and a PA controller 300. The PA 104 receives the RF input signal 106 from the TXIC 102 through a SAW filter 214, amplifies it, and outputs the RF output signal 110. The RF input signal 106 is a modulated RF signal that is modulated by the baseband TXIC 102 according to a wireless communication standard, such as 3GPP. The SAW filter 214 is optional and is needed if the TXIC output signal 106 needs to be filtered to suppress unwanted noise outside the desired band. The power supply 202 is coupled to a supply voltage $V_{BATT}$ 219 to provide the supply voltage 108 to the PA 104. The overall function of the PA controller 300 is to adjust the supply voltage 108 to the PA 104 to a level as low as possible while maintaining the distortion of the RF output signal 110 near an acceptable limit (e.g., a limit defined by standards covering the RF device, such as 3GPP specifications). By keeping the supply voltage 108 of the PA 104 as low as possible, the efficiency of the PA 104 is increased significantly.

The PA controller 300 includes, among other components, an amplitude detector 302, an ADC 206, a comparison block 209, an error amplifier 210, and an optional track and hold (T/H) block 222. Note that the PA controller 300 does not need a frequency downconversion module, because the amplitude detector 302 detects the amplitude of the RF output signal 201 detected via a coupler or capacitive tap 220. The amplitude value 351 of the detected output RF signal 201 is converted to a digital signal 353 by the ADC 206 and compared in time-domain (waveform to waveform) to the reference baseband modulation information 215 (amplitude information) from the TXIC 102 to generate the estimated distortion level signal 213' indicating the actual level of distortion in the RF output signal 110. A time-domain comparison means that signal points of the waveforms for the digital signal 353 and the reference baseband modulation amplitude information 215 are aligned in time with each other and compared, point-to-point. As explained above, a delay may be added to the reference modulation amplitude information 215 for proper alignment before comparison with the digital amplitude signal 353. As can be seen, the estimated distortion level signal 213' is generated based on the amplitude of the detected RF output signal 201, but not based on the phase information of the detected RF output signal 201.

The estimated distortion level signal 213' is compared to the predetermined target distortion level signal 216 in the error amplifier 210 to generate a supply voltage control signal 217. The target distortion level signal 216 is set to represent an acceptable distortion level at the RF output signal 110. For example, the target distortion level 216 can be set to a constant level corresponding to an EVM (error vector magnitude) level of 3% at output 110 of PA 104. A control loop is created to servo the supply voltage 108 to the PA 104 in a manner which targets the acceptable distortion level in the RF output signal 110. Note that, while an error amplifier 210 is shown here, the error amplifier 210 may be replaced by any element which causes an increase or decrease in the supply voltage 108 based on a difference between the estimated distortion level signal 213' and the target distortion level 216.

In addition, the comparison block 209 generates another signal (TXIC OUT adjust) 212' that simultaneously provides a rapid measure of the power of the RF output signal 110 of the PA 104 with respect to the reference modulation amplitude level 215 from the TXIC 102, thus providing a control means to adjust the input power to the PA 104 from the TXIC 102 to compensate for unwanted changes in the PA output power caused by changes in the PA supply voltage.

Figure 3B:
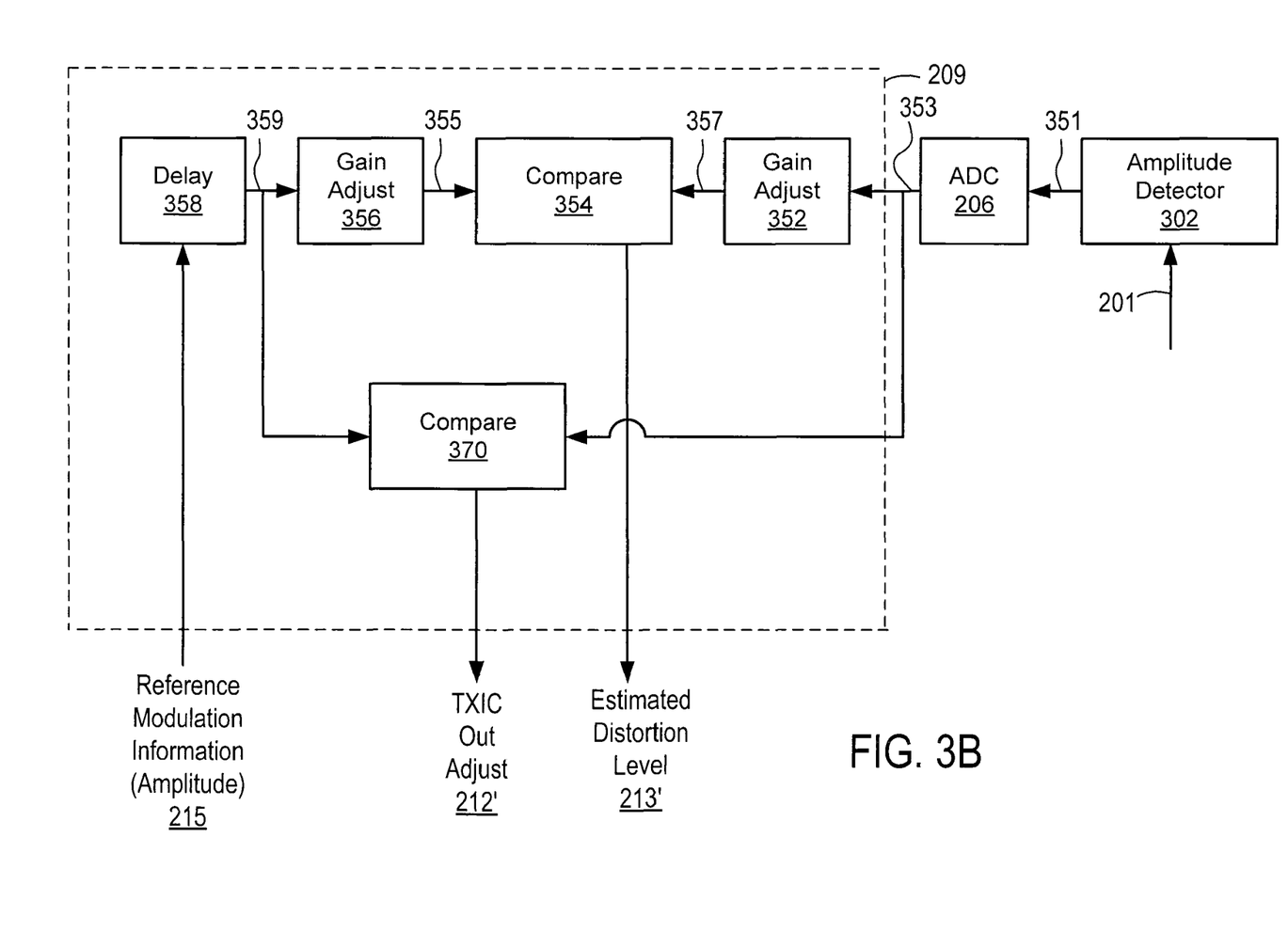
FIG. 3B illustrates the comparison block of FIG. 3A in more detail, according to the second embodiment of the present invention.

FIG. 3B illustrates the comparison block of FIG. 3A in more detail, according to the second embodiment of the present invention. The comparison block 209 includes a delay module 358, gain adjust modules 352, 356, and compare module 354, 370. The amplitude detector 302 detects the amplitude of the RF output signal 201 detected via a coupler or capacitive tap 220. The amplitude value 351 of the detected output RF signal 201 is converted to a digital signal 353 by the ADC 206. Then, the digital amplitude value 353 is adjusted by the gain adjust module 352 to generate a gain-adjusted digital amplitude value 357.

The delay module 358 adds a delay to the reference modulation amplitude information 215 for proper alignment before comparison with the gain-adjusted digital amplitude signal 357. The gain of the delayed reference modulation amplitude information 359 is adjusted by the gain adjust module 356. The delayed, gain adjusted reference modulation amplitude information 355 is compared in time-domain (waveform to waveform) to the gain-adjusted digital amplitude value 357 in the compare module 354 to generate the estimated distortion level signal 213' indicating the level of distortion in the RF output signal 110. Additionally, the compare module 370 compares the average amplitude level of the digital value of the detected RF output signal 353 with the average amplitude level of the delayed reference modulation amplitude information 359 to generate the TXIC OUT adjust signal 212' indicating the power level of the output RF signal 110 in comparison to the reference modulation amplitude information 215.

Since the second embodiment of FIGS. 3A and 3B does not require a downconversion of the RF output 110 of the PA, a local oscillator (which may be difficult to generate), down-converting mixer circuitry (quadrature de-modulator), and a de-rotating block are not required. In many cases, the amplitude distortion is the dominant distortion, and thus measuring the distortion of the RF output signal 110 based on only the amplitude distortion may be sufficient.

Figure 4:
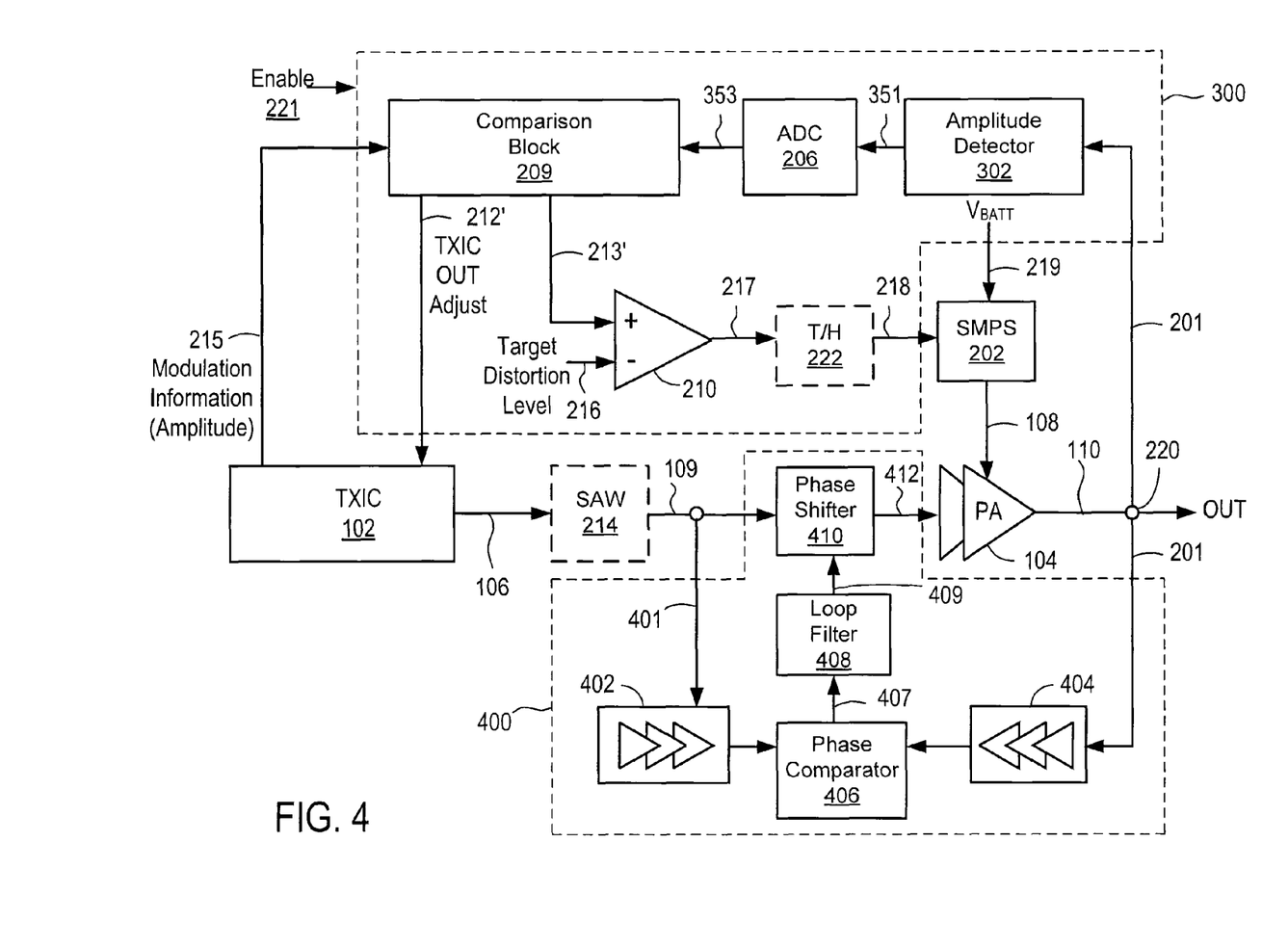
FIG. 4 illustrates an RF PA system that includes a PA controller for adjusting the supply voltage to the power amplifier based upon a distortion level of the output of the PA compared to a target distortion level, according to a third embodiment of the present invention.

FIG. 4 illustrates an RF PA system that includes a PA controller for adjusting the supply voltage to the power amplifier based upon an estimated distortion level of the output of the PA compared to a target distortion level, according to a third embodiment of the present invention. The third embodiment of FIG. 4 is identical to the second embodiment of FIG. 3A, except that the PA controller additionally includes a phase control (correction) loop 400. The phase correction loop 400 compares the phase of the RF input signal to the phase of the RF output signal of the PA 104, and controls the phase shift (i.e., AM to PM modulation) between the RF input signal and the RF output signal of the PA 104 to compensate for phase shifts caused by the PA 104 while it passes the modulated RF signal.

The phase control loop 400 includes limiters 402, 404, a phase comparator 406, a loop filter (PLF (Phase Loop Filter)) 408, and a phase shifter 410. The phase control loop 400 monitors the RF input signal 401 from the transmitter IC 102 and the optional SAW filter 402 and compares the phase of the RF input signal 401 with the phase of the RF output signal 201 of the PA 104 detected via the coupler or capacitive tap 220. Based on such phase comparison, the phase comparator 406 generates a phase error signal or phase correction signal 407 that indicates the difference between the phases of the RF input signal 401 and the RF output signal 201. The phase error signal 407 is filtered by the loop filter 408 to generate the phase control signal 409. The phase control signal 409 is input to the phase shifter 410 to control the shifting of the phase of the input RF signal 412 so that the phase of the output RF signal 110 dynamically matches the phase of the transmitter signal 106.

Removing phase distortion offers at least the following two advantages: (a) it improves the accuracy of the power amplifier controller's amplitude-only distortion based measurement in the third embodiment of FIG. 4, since phase distortion is no longer present, and (b) it could allow a PA with significant AM-PM remodulation characteristics to be used in the system, without impacting the distortion at the PA output.

Figure 5:
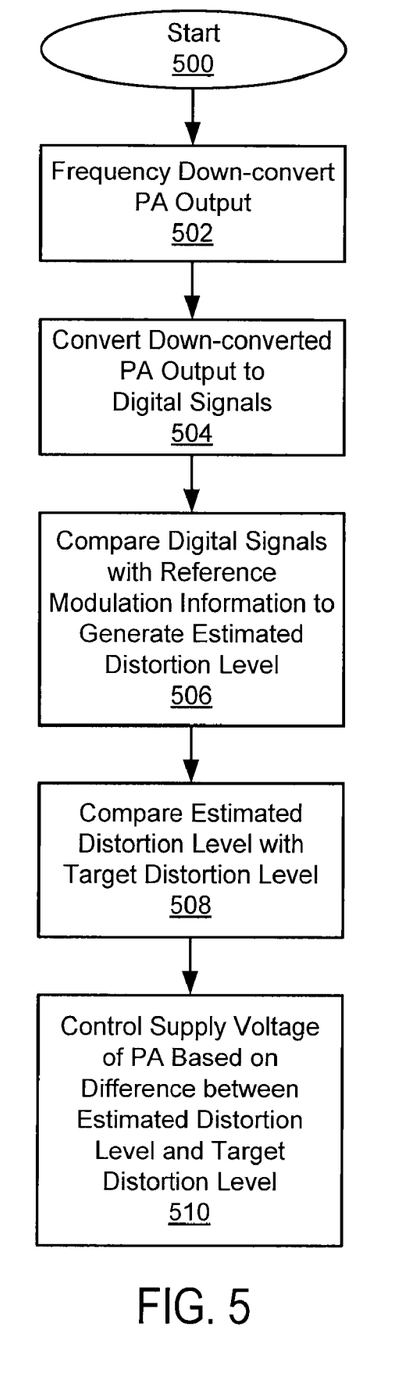
FIG. 5 illustrates a method for controlling the PA in an RF PA system by adjusting the supply voltage to the PA based upon an estimated distortion level of the output of the PA compared to a target distortion level, according to a first embodiment of the present invention.

FIG. 5 illustrates a method for controlling the PA in an RF PA system by adjusting the supply voltage to the PA based upon an estimated distortion level of the output of the PA compared to a target distortion level, according to a first embodiment of the present invention. Referring to FIGS. 5 and 2A-2B, as the process starts 500, the PA output signal 201 is frequency-downconverted 502 and converted 504 to digital signals 207, 207'. The digital signals 207, 207' are compared 506 with reference modulation information 214, 214' to generate an estimated distortion level signal 213. The estimated distortion level signal 213 is compared 508 with a target distortion level 216, and the supply voltage 108 to the PA 104 is controlled 510 based on a difference between the estimated distortion level 213 and the target distortion level 216.

Figure 6:
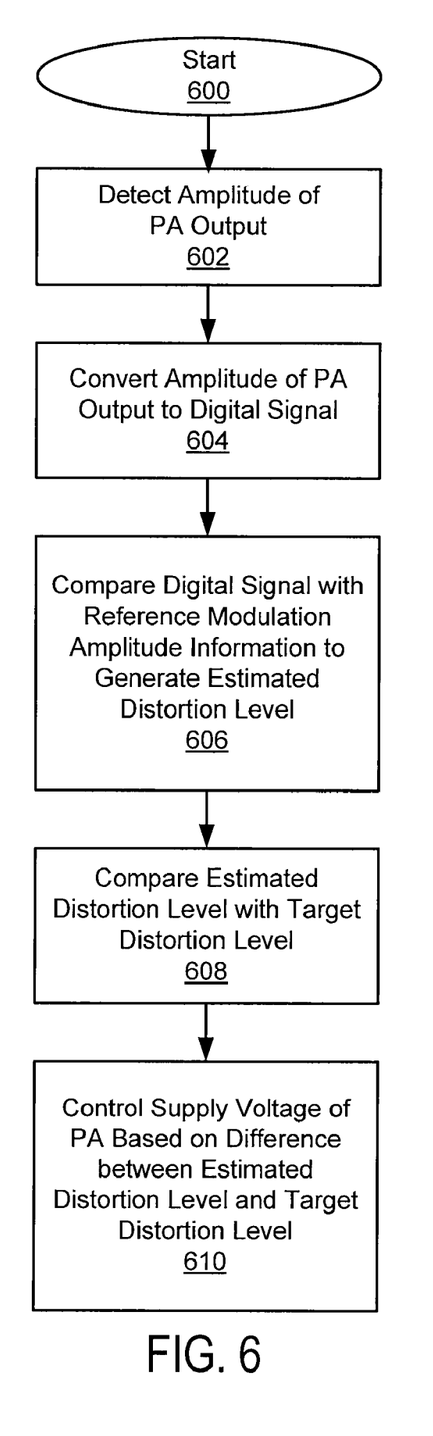
FIG. 6 illustrates a method for controlling the PA in an RF PA system by adjusting the supply voltage to the PA based upon an estimated distortion level of the output of the PA compared to a target distortion level, according to a second embodiment of the present invention.

FIG. 6 illustrates a method for controlling the PA in an RF PA system by adjusting the supply voltage to the PA based upon an estimated distortion level of the output of the PA compared to a target distortion level, according to a second embodiment of the present invention. Referring to FIGS. 6 and 3A-3B, as the process starts 600, the amplitude of the PA output signal 201 is detected 602 and its amplitude value 351 is converted 604 to a digital signal 353. The digital signal 353 is compared 606 with reference modulation amplitude information 215 to generate an estimated distortion level signal 213'. The estimated distortion level 213' is compared 608 with a target distortion level 216, and the supply voltage 108 to the PA 104 is controlled 610 based on a difference between the estimated distortion level 213' and the target distortion level 216.

Figure 7:
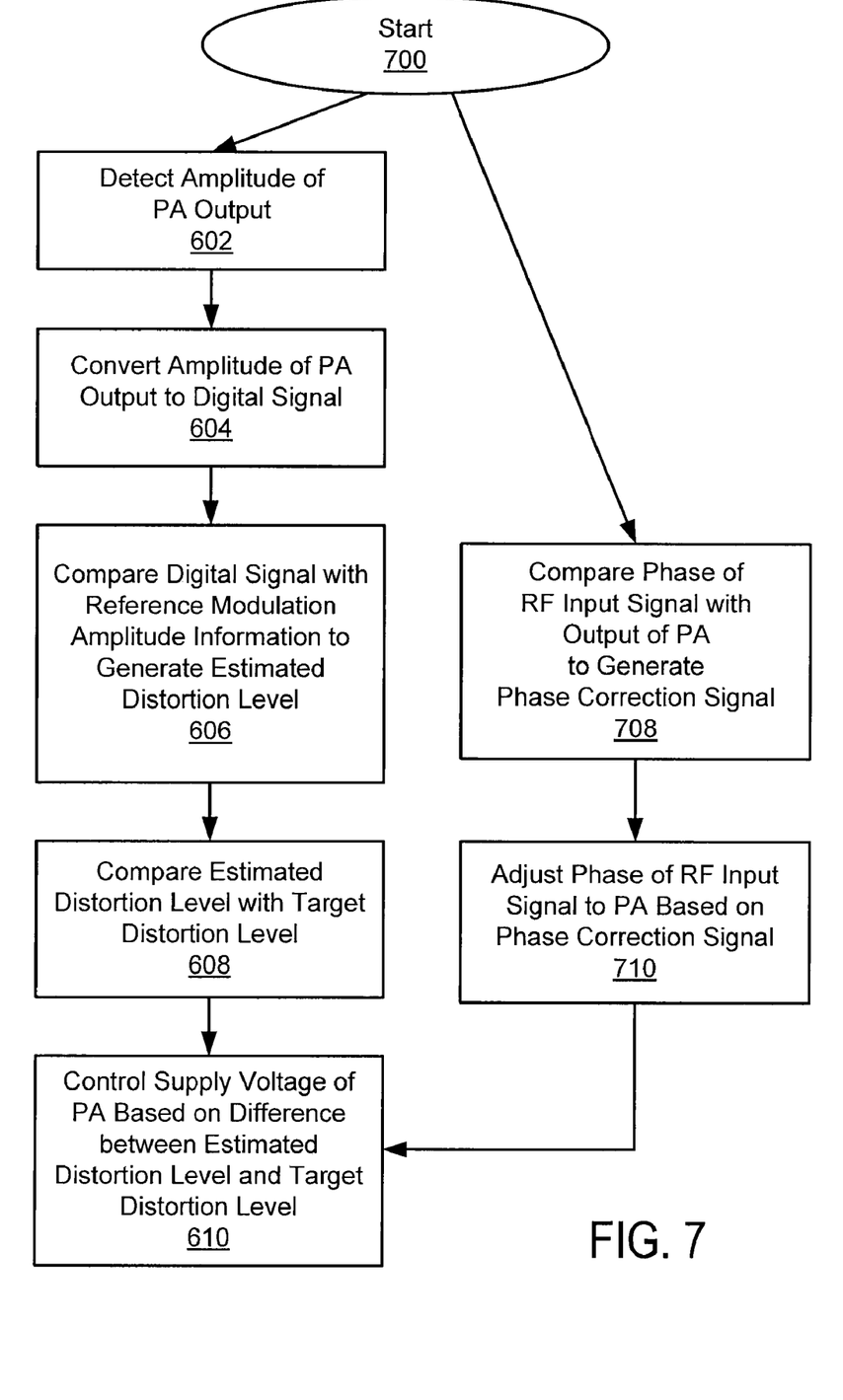
FIG. 7 illustrates a method for controlling the PA in an RF PA system by adjusting the supply voltage to the PA based upon an estimated distortion level of the output of the PA compared to a target distortion level and adjusting the phase of the RF input signal to the RF PA, according to a third embodiment of the present invention.

FIG. 7 illustrates a method for controlling the PA in an RF PA system by adjusting the supply voltage to the PA based upon an estimated distortion level of the output of the PA compared to a target distortion level, according to a third embodiment of the present invention. The method according to the third embodiment in FIG. 7 is substantially the same as the method according to the second embodiment in FIG. 6, except that steps 708 and 710 are added and performed in parallel with steps 602 through 610. In step 708, the phase of the RF input signal 106 is compared with the phase of the output 201 of the PA to generate the phase correction signal 407. In step 710, the phase of the RF input signal 412 to the PA 104 is adjusted based on the phase correction signal 407.

Upon reading this disclosure, those of skill in the art will appreciate still additional alternative structural and functional designs for a RF power amplifier system efficiently controlled by a PA controller. For example, although the first, second, and third embodiments are shown herein as implemented in digital circuitry using ADCs in FIGS. 2A-2B, 3A-3B, and 4, respectively, and the comparison in the comparison blocks 208, 209 is performed digitally, they can very well be implemented with analog circuitry to perform such comparison in analog circuits. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A radio frequency (RF) power amplifier system, comprising:
   a power amplifier coupled to receive and amplify an RF input signal to generate an RF output signal; and a power amplifier controller coupled to the power amplifier for controlling a supply voltage to the power amplifier based upon a supply voltage control signal representing a difference between an estimated distortion level of the RF output signal and a predetermined distortion level, the estimated distortion level determined from a comparison of detected amplitude and phase modulation of the RF output signal with reference modulation information including desired amplitude and phase modulation of the RF output signal, and the predetermined distortion level corresponding to an allowable distortion level in the RF output signal.

2. The RF power amplifier system of claim 1, wherein the detected amplitude and phase modulation of the RF output signal is sampled and adjusted in time and amplitude for alignment with samples of the reference modulation information for comparison with each other.

3. The RF power amplifier system of claim 1, wherein the power amplifier controller comprises:

a quadrature demodulator configured to downconvert the RF output signal into I and Q components;

a first analog-to-digital converter and a second analog-to-digital converter configured to receive the downconverted I and Q components of the RF output signal, respectively, and to generate a first digital signal and a second digital signal corresponding to the downconverted I and Q components of the RF output signal, respectively;

a first comparator module and a second comparator module configured to compare the first digital signal and the second digital signal with reference I and Q components of the reference modulation information, respectively, to generate a first comparison signal and a second comparison signal, respectively; and a combiner module configured to combine the first comparison signal and the second comparison signal to determine the estimated distortion level.

4. The RF power amplifier system of claim 1, wherein the power amplifier controller further comprises a first delay and a second delay configured to add a delay in time to the reference I and Q components of the reference modulation information to align in time the reference I and Q components of the reference modulation with the first and second digital signals, respectively.

5. The RF power amplifier system of claim 1, wherein the power amplifier controller is configured to increase the supply voltage to the power amplifier if the estimated distortion level is greater than the predetermined distortion level and to decrease the supply voltage to the power amplifier if the estimated distortion level is smaller than the predetermined distortion level.

6. The RF power amplifier system of claim 1, wherein power of the RF input signal is adjusted to compensate for a change of gain of the power amplifier responsive to the supply voltage being adjusted.

7. The RF power amplifier system of claim 1, wherein the power amplifier controller is configured to further generate an estimated power control signal estimating power of the RF output signal based on the comparison of the detected modulation of the RF output signal with the reference modulation information including desired amplitude modulation of the RF output signal, power of the RF input signal being adjusted based on the estimated power control signal.

8. The RF power amplifier system of claim 1, wherein the supply voltage is adjusted in intervals, and maintained constant between the intervals.

9. The RF power amplifier system of claim 1, wherein the power amplifier controller further comprises a track and hold module, the track and hold module in a first mode configured to generate the supply voltage control signal that tracks the difference between the estimated distortion level of the RF output signal and the predetermined distortion level; and the track and hold module in a second mode configured to maintain the supply voltage control signal at a constant level.

10. The RF power amplifier system of claim 1, wherein the power amplifier controller controls the supply voltage to the power amplifier based upon the supply voltage control signal, responsive to an enable signal being in an active state.

11. A radio frequency (RF) power amplifier system, comprising:

a power amplifier coupled to receive and amplify an RF input signal to generate an RF output signal; and a power amplifier controller coupled to the power amplifier for controlling a supply voltage to the power amplifier based upon a supply voltage control signal representing a difference between an estimated distortion level of the RF output signal and a predetermined distortion level, the estimated distortion level determined from a comparison of detected amplitude of the RF output signal with reference modulation amplitude information corresponding to a desired amplitude of the RF output signal, and the predetermined distortion level corresponding to an allowable distortion level in the RF output signal.

12. The RF power amplifier system of claim 11, wherein the detected amplitude of the RF output signal is sampled and adjusted in time and amplitude for alignment with samples of the reference modulation amplitude information for comparison with each other.

13. The RF power amplifier system of claim 11, wherein the power amplifier controller comprises:

an amplitude detector configured to detect the amplitude of the RF output signal;

an analog-to-digital converter configured to convert the detected amplitude of the RF output signal to a digital signal; and a comparator configured to compare the digital signal with the reference modulation amplitude information to determine the estimated distortion level.

14. The RF power amplifier system of claim 11, wherein the power amplifier controller further comprises a delay configured to add a delay in time to the reference modulation amplitude information to align in time the reference modulation amplitude information with the digital signal.

15. The RF power amplifier system of claim 11, wherein the power amplifier controller is configured to increase the supply voltage to the power amplifier if the estimated distortion level is greater than the predetermined distortion level and to decrease the supply voltage to the power amplifier if the estimated distortion level is smaller than the predetermined distortion level.

16. The RF power amplifier system of claim 11, wherein power of the RF input signal is adjusted to compensate for a change of gain of the power amplifier responsive to the supply voltage being adjusted.

17. The RF power amplifier system of claim 11, wherein the power amplifier controller is configured to further generate an estimated power level signal estimating power of the RF output signal based on the comparison of the detected amplitude of the RF output signal with the reference modulation amplitude information, power of the RF input signal being adjusted based on the estimated power level signal.

18. The RF power amplifier system of claim 11, wherein the supply voltage is adjusted in intervals, and maintained constant between the intervals.

19. The RF power amplifier system of claim 11, wherein the power amplifier controller comprises a track and hold module,
the track and hold module in a first mode configured to generate the supply voltage control signal that tracks the difference between the estimated distortion level of the RF output signal and the predetermined distortion level; and
the track and hold module in a second mode configured to maintain the supply voltage control signal at a constant level.

20. The RF power amplifier system of claim 11, wherein the power amplifier controller controls the supply voltage to the power amplifier based upon the supply voltage control signal, responsive to an enable signal being in an active state.

21. The RF power amplifier system of claim 11, wherein the power amplifier controller further comprises a phase control loop configured to generate a phase error signal indicative of a phase difference between phases of the RF input signal and the RF output signal and to adjust the phase of the RF input signal based upon the phase error signal to reduce phase distortion generated by the power amplifier.

22. The power amplifier control circuit of claim 21, wherein the phase control loop comprises:
a phase comparator configured to compare the phase of the RF input signal with the phase of the RF output signal to generate the phase error signal; and
a phase shifter coupled to the phase comparator and an input of the power amplifier, the phase shifter shifting the phase of the RF input signal to the power amplifier based upon the phase error signal.

23. In a radio frequency (RF) power amplifier system, a method of controlling a power amplifier receiving and amplifying an RF input signal to generate an RF output signal, the method comprising:
comparing detected amplitude and phase modulation of the RF output signal with reference modulation information including desired amplitude and phase modulation of the RF output signal to determine an estimated distortion level of the RF output signal;
comparing the estimated distortion level with a predetermined distortion level corresponding to an allowable distortion level in the RF output signal; and
controlling a supply voltage to the power amplifier based upon a difference between the estimated distortion level and the predetermined distortion level.

24. In a radio frequency (RF) power amplifier system, a method of controlling a power amplifier receiving and amplifying an RF input signal to generate an RF output signal, the method comprising:
comparing detected amplitude of the RF output signal with reference modulation amplitude information to determine an estimated distortion level of the RF output signal;
comparing the estimated distortion level with a predetermined distortion level corresponding to an allowable distortion level in the RF output signal; and
controlling a supply voltage to the power amplifier based upon a difference between the estimated distortion level and the predetermined distortion level.

25. The method of claim 24, further comprising:
determining a phase error indicative of a phase difference between phases of the RF input signal and the RF output signal; and
adjusting the phase of the RF input signal based on the phase error to reduce phase distortion generated by the power amplifier.

* * * * *